United States Patent
Komaki

(10) Patent No.: US 8,258,829 B2
(45) Date of Patent: Sep. 4, 2012

(54) POWER SWITCH CIRCUIT AND SEMICONDUCTOR INTEGRATED CIRCUIT DEVICE

(75) Inventor: Masaki Komaki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/561,046

(22) Filed: Sep. 16, 2009

(65) Prior Publication Data
US 2010/0001782 A1    Jan. 7, 2010

Related U.S. Application Data

(63) Continuation of application No. PCT/JP2007/055359, filed on Mar. 16, 2007.

(51) Int. Cl.
*H03L 7/00* (2006.01)
(52) U.S. Cl. ...................................................... 327/142
(58) Field of Classification Search .................. 327/143, 327/399, 408
See application file for complete search history.

(56) References Cited

U.S. PATENT DOCUMENTS

| | | | |
|---|---|---|---|
| 6,414,363 B1 * | 7/2002 | Mizuguchi | 257/394 |
| 6,766,222 B1 | 7/2004 | Duley | |
| 2003/0184364 A1 | 10/2003 | Miyagi | |

FOREIGN PATENT DOCUMENTS

| | | |
|---|---|---|
| JP | 2-151115 A | 6/1990 |
| JP | 3266519 A | 11/1991 |
| JP | 7-142982 A | 6/1995 |
| JP | 2001044822 A * | 2/2001 |
| JP | 2001143477 A | 5/2001 |
| JP | 2003289245 A | 10/2003 |
| JP | 2004503996 | 2/2004 |
| WO | WO-2001096993 | 12/2001 |

OTHER PUBLICATIONS

Translation of JP 2001-044822.*

* cited by examiner

*Primary Examiner* — Lincoln Donovan
*Assistant Examiner* — Daniel Rojas
(74) *Attorney, Agent, or Firm* — Fujitsu Patent Center

(57) ABSTRACT

A power switch circuit that ensures suppression of an increase in a transient current. The power switch circuit includes a first transistor, which generates an output voltage in response to a control signal, and a time difference generation circuit, which delays the control signal by performing a logical process with the output voltage of the first transistor and the control signal.

20 Claims, 3 Drawing Sheets

POWER SWITCH CIRCUIT AND SEMICONDUCTOR INTEGRATED CIRCUIT DEVICE

FIELD

The present invention relates to a power switch circuit which controls the supply of power to an internal circuit of a semiconductor integrated circuit device.

BACKGROUND

When internal circuits of a semiconductor integrated circuit device is supplied with power and the internal circuits are simultaneously supplied with power, transient current noise increases and generates power noise. Therefore, semiconductor integrated circuits are provided with a plurality of power switch circuits arranged between power supplies and internal circuits. The power switch circuits sequentially become conductive to suppress the peak value of the transient current. The operation of such power switch circuits must be stabilized.

FIG. 5 shows an example of a prior art semiconductor integrated circuit device including power switch circuits SW1 to SWn. The power switch circuits SW1 to SWn are arranged between a high potential power supply $V_{DD}$ and a plurality of logic circuits 1. Each logic circuit 1 is supplied with power $V_{SS}$. When each of the power switch circuits SW1 to SWn becomes conductive, each logic circuit 1 is supplied with the power $V_{DD}$.

The power switch circuits SW1 to SWn sequentially become conductive in response to a control signal E provided from a power control circuit. That is, a control signal E is input to an input terminal EI of the power switch circuit SW1 in the initial stage. After a predetermined delay time elapses, the control signal E is provided from an output terminal EO to the power switch circuit SW2 in the next stage.

In the same manner, the power switch circuit SW2 becomes conductive in response to the control signal E input to the input terminal EI. After a predetermined delay time elapses, the control signal E is provided from an output terminal EO to the power switch circuit SW3 in the next stage.

FIG. 6 shows the structure of the power switch circuits SW1 to SWn. The power switch circuits SW1 to SWn have identical structures. Thus, the power switch circuit SW1 will now be described.

The control signal E is input to the input terminal EI and provided to the gate of a P-channel MOS transistor T1. Therefore, when an L level signal is input to the input terminal EI, the transistor T1 becomes conductive and the power $V_{DD}$, which is supplied to a terminal PS, is supplied from a terminal PD to the logic circuit 1.

The signal EI input to the input terminal E is output from the output terminal EO through a time difference generation circuit 2. The time difference generation circuit 2 includes, for example, an even number of series-coupled inverter circuits 3 as shown in FIG. 7.

In such a configuration, each of the power switch circuits SW1 to SWn transfers the control signal E after the delay time set by the time difference generation circuit 2 elapses. Thus, the transistors T1 sequentially become conductive as the control signal E and the power $V_{DD}$ is sequentially supplied to the logic circuits 1.

In the semiconductor integrated circuit device that includes the power switch circuits SW1 to SWn, the power switch circuits SW1 to SWn sequentially become conductive, and the plurality of logic circuits 1 are sequentially supplied with the power $V_{DD}$. This suppresses the transient current.

However, the timing difference in which the power switch circuits SW1 to SWn become conductive is fixed by the time difference generation circuit 2. Thus, when a transient current flows to the power switch circuit in the preceding stage due to a load change in the logic circuit 1, this may cause the power switch circuit in the next stage to become conductive.

Transient current may flow in parallel to the plurality of power switch circuits. This results in a shortcoming in which an increase in the transient current still cannot be suppressed.

SUMMARY

It is an object of the present invention to provide a power switch circuit that ensures suppression of increases in transient currents.

A first aspect of the present invention provides a power switch circuit. The power switch circuit includes a first transistor which generates an output voltage in response to a control signal. A time difference generation circuit delays the control signal by performing a logical process with the control signal and the output voltage of the first transistor.

A second aspect of the present invention provides a semiconductor integrated circuit device. The semiconductor integrated circuit device includes a plurality of logic circuits and a plurality of power switch circuits which sequentially become conductive in response to a control signal and which are respectively coupled to the plurality of logic circuits. Each of the plurality of power switch circuits includes a first transistor, which generates an output voltage in accordance with a voltage of a high potential power supply in response to the control signal and supplies the output voltage to the corresponding logic circuit, and a time difference generation circuit, which delays the control signal by performing a logical process with the control signal and the output voltage of the first transistor.

DESCRIPTION OF EMBODIMENTS

[First Embodiment]

A first embodiment of a semiconductor integrated circuit device according to the present invention will now be discussed with reference to the drawings.

Figure 1:
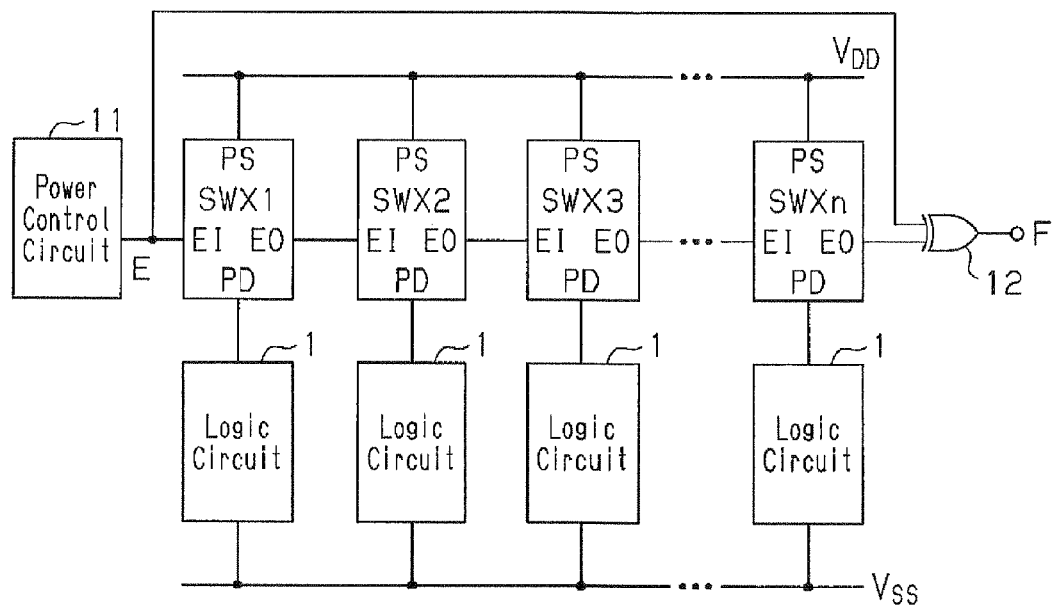
FIG. 1 is a block diagram showing a first embodiment of the semiconductor integrated circuit including a plurality of power switch circuits.

FIG. 1 shows a semiconductor integrated circuit device including a plurality of power switch circuits SWX1 to SWXn respectively supplying a plurality of logic circuits 1 with power $V_{DD}$. The power switch circuits SWX1 to SWXn sequentially become conductive in response to a control signal E provided from a power control circuit 11 to sequentially supply the plurality of logic circuits 1 with the power $V_{DD}$.

The power switch circuits SWX1 to SWXn have identical structures. Thus, the structure of the power switch circuit SWX1 will now be described in detail with reference to FIG. 2.

Input terminal EI, which receives a control signal E, is coupled to the gate of a P-channel MOS transistor T1, which is a switch transistor. The transistor T1 has a source coupled to a terminal PS, which receives the power $V_{DD}$, and a drain coupled to a terminal PD, which supplies the power $V_{DD}$ to the logic circuit 1.

The input terminal EI is coupled to the initial one of the two stages of series-coupled inverter circuits 13a and 13b, and the output terminal of the next stage inverter circuit 13b is coupled to an output terminal EO of the power switch circuit SWX1. In the first embodiment, the inverter circuits 13a and 13b form a transfer unit.

The inverter circuit 13a is configured by a P-channel MOS transistor TP1 and an N-channel MOS transistor TN1, and the inverter circuit 13b is configured by a P-channel MOS transistor TP2 and an N-channel MOS transistor TN2. The sources of the transistors TP1 and TP2 are coupled to the terminal PS. Power $V_{SS}$ is supplied to the source of the transistor TN1 in the inverter circuit 13a.

An N-channel MOS transistor (activation transistor) T2 is arranged between the power VSS and the source of the transistor TN2 of the inverter circuit 13b, and the gate of the transistor T2 is coupled to the terminal PD. The threshold value of the transistor T2 is desirably set at a high value. In the first embodiment, the inverter circuits 13a and 13b and transistor T2 form a time difference generation circuit 20.

As shown in FIG. 1, the output signal power switch circuit SWXn in the final stage is supplied to an EOR (exclusive OR) circuit 12, which is a logical operation circuit. The EOR circuit 12 performs an exclusive OR operation with the control signal E provided to the first stage power switch circuit SWX1 and the output signal of the power switch circuit SWXn to generate a determination signal representing the operation result.

The operation of the semiconductor integrated circuit device including the power switch circuits SWX1 to SWXn will now be discussed.

In each of the power switch circuits SWX1 to SWXn, when an L level signal E is provided to the input terminal EI, the transistor T1 is activated thereby starting the supply of the power $V_{DD}$ from the terminal PD to the logic circuit 1. Further, a transient current starts to flow to the logic circuit 1. Also, the control signal E is transferred to the inverter circuits 13a and 13b.

As the transient current of the logic circuit 1 converges and the potential at the terminal PD increases to a level close to the power $V_{DD}$, the transistor T2 is activated. This activates the inverter circuit 13b, and an L level output signal having the same phase as the control signal E is output from the output terminal EO.

In each of the power switch circuit SWX1 to SWXn, such an operation supplies current from the terminal PD to the logic circuit 1 based on the input of an L level control signal E. After the transient current converges and the terminal PD increases to a level close to the power $V_{DD}$, an L level output signal is provided from the output terminal EO to the next stage power switch circuit. Therefore, the next stage power switch circuit does not become conductive during a period in which a transient current flows from a single power switch circuit to the logic circuit 1.

After an H level control signal E is output from the power control circuit 11 and the control signal E falls to an L level to supply the power $V_{DD}$ to each logic circuit 1, the EOR circuit 12 generates an H level determination signal F as an initial value.

Then, when an L level output signal is output from the output terminal EO of the power switch circuit SWXn in the final stage based on the L level control signal E provided from the power control circuit 11, the EOR circuit 12 generates an L level determination signal F.

As a result, by using, for example, an external device (not shown) to detect the L level determination signal F, it can be verified that the transistor T1 of each of the power switch circuits SWX1 to SWXn is operating normally and the power $V_{DD}$ is being supplied to the logic circuits 1.

This is because the transistor T1 must operate normally and the potential at the terminal PD must increase for the output signal of the power switch circuits SWX1 to SWXn to fall to the L level.

When the determination signal F remains at the H level without falling to the L level after the L level control signal E is output from the power control circuit 11, there is a possibility that the transistor T1 in one of the logic circuits 1 is not operating normally or an abnormal current continuously flowing in one of the logic circuits 1. Therefore, the use of the external device enables determination of whether there is an abnormality in the semiconductor integrated circuit device.

When an H level control signal E is output from the power control circuit 11, that is, in a standby state, the transistor T1 in the power switch circuit SWX1 is inactivated. This stops the supply of power from the power switch circuit SWX1 to the logic circuit 1 and stops the flow of leakage current from the power $V_{DD}$ to the logic circuit 1.

The H level control signal E also generates an L level output signal with the inverter circuit 13a and an H level output signal EO with the inverter circuit 13b. Therefore, an H level signal is supplied to the input terminals ET of every one of the power switch circuits SWX1 to SWXn. Further, in the same manner as the power switch circuit SWX1, the supply of power to the logic circuits corresponding to the power switch circuits SWX2 to SWXn is stopped, and the flow of leakage current is stopped.

The power switch circuits SWX1 to SWXn of the first embodiment has the advantages described below.

(1) Regardless of a load change in each logic circuit 1, transient current does not flow in parallel to the logic circuits 1 from two or more power switch circuits. Therefore, an increase in the transient current is suppressed, and fluctuation of the power voltage is also suppressed.

(2) During operation testing, the determination signal F may be used to determine whether or not the transistor T1 of each power switch circuit is operating normally.

(3) During normal usage, the determination signal F may be used to determine whether or not abnormal current is flowing to the logic circuits 1 when power is being supplied from the power switch circuits to the logic circuits 1.

(4) If the control signal E is set at an H level in a standby state, the supply of the power $V_{DD}$ from the power switch circuits SWX1 to SWXn to the logic circuits 1 is stopped, and the flow of leakage current from the power $V_{DD}$ to the logic circuits 1 is stopped.

[Second Embodiment]

Figure 2:
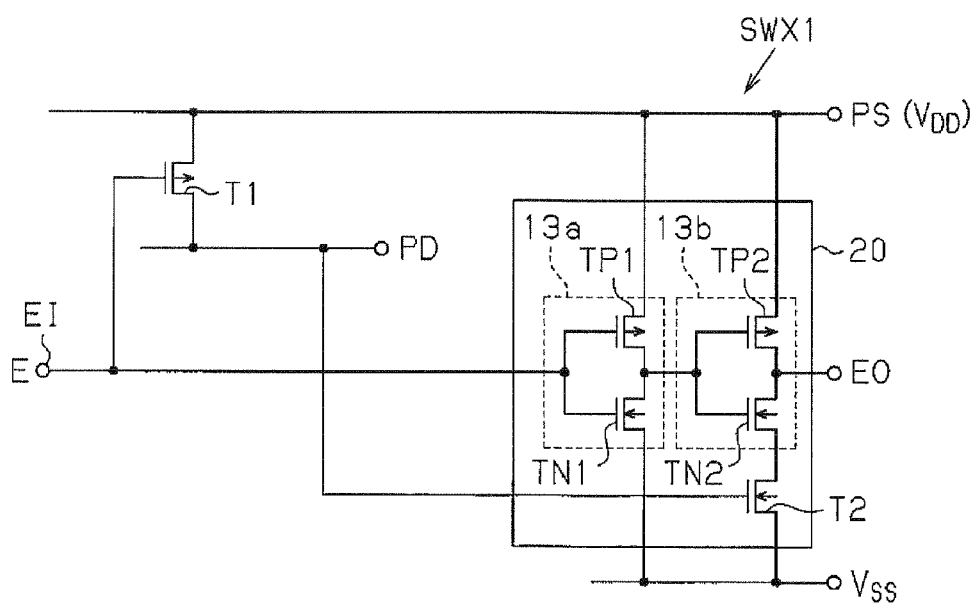
FIG. 2 is a circuit diagram of the power switch circuit of FIG. 1.
Figure 3:
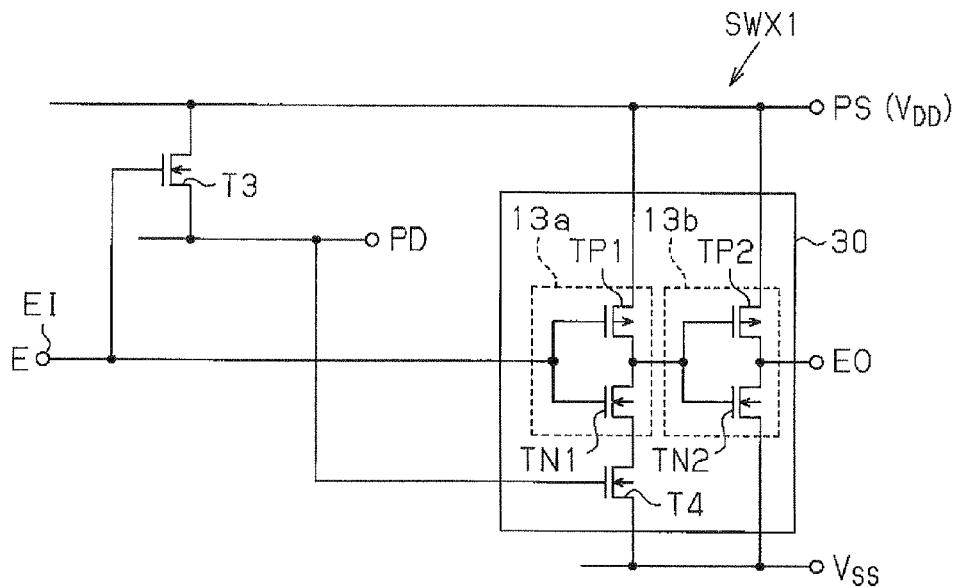
FIG. 3 is a circuit diagram showing the power switch circuit of a second embodiment.

FIG. 3 shows a second embodiment. The second embodiment uses different power switch circuits SWX1 to SWXn. In the second embodiment, the switch transistor T1 of each of the power switch circuits SWX1 to SWXn shown in FIG. 2 is replaced by an N-channel MOS transistor T3. The same reference numbers are given to parts of the power switch circuits SWX1 to SWXn that are the same as those of the first embodiment.

The input terminal EI, which receives the control signal E, is coupled to the gate of an N-channel MOS transistor T3, which is a switch transistor. The transistor T3 has a drain coupled to the terminal PS, which receives the power $V_{DD}$, and the source is coupled to the terminal PD, which supplies the power $V_{DD}$ to the logic circuit 1.

The input terminal EI is coupled to the initial one of the two stages of series-coupled inverter circuits 13a and 13b, and the output terminal of the next stage inverter circuit 13b is coupled to the output terminal EO of the power switch circuit.

The sources of the P-channel MOS transistors TP1 and TP2 of the inverter circuits 13a and 13b are coupled to the terminal PS, and an N-channel MOS transistor T4 is arranged between the power $V_{SS}$ and the source of the N-channel MOS transistor TN1 in the inverter circuit 13a. In the second embodiment, the inverter circuits 13a and 13b and the transistor T4 form a time difference generation circuit 30.

In the power switch circuit SWX1, when the control signal E rises to the H level, the transistor T3 is activated and the power $V_{DD}$ is supplied from the terminal PD to the logic circuit 1. Further, transient current flowing to the logic circuit 1 is converged, and when the terminal PD increases to a level close to the power $V_{DD}$, the transistor T4 is activated and the inverter circuit 13a is activated. Therefore, the inverter circuit 13a generates an L level output signal.

As a result, the output signal of the inverter circuit 13b rises to the H level, and an H level output signal is output from the output terminal EO to the power switch circuit in the next stage.

When the control signal E falls to the L level, the transistor T3 is inactivated, the supply of the power $V_{DD}$ to the logic circuit 1 is stopped, and the flow of leakage current to the logic circuit 1 is stopped. Then, an L level output signal is provided from the output terminal to the power switch circuit in the next stage, and each power switch operates in the same manner.

In the second embodiment, such an operation obtains the same advantages as the power switch circuits of the first embodiment.

[Third Embodiment]

Figure 4:
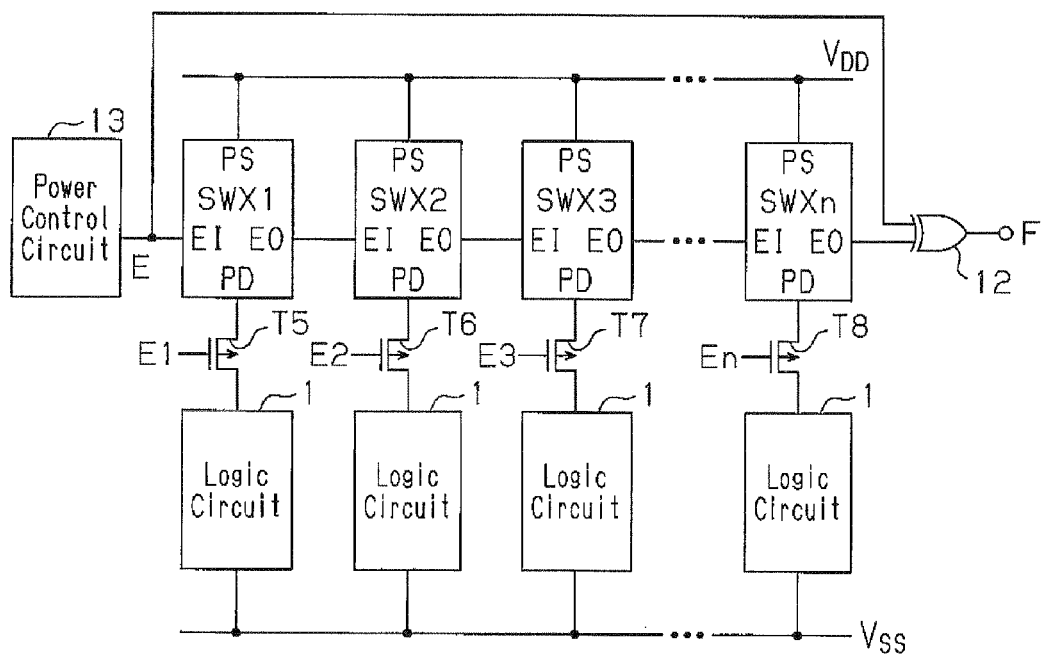
FIG. 4 is a block diagram showing a third embodiment of the semiconductor integrated circuit including a plurality of power switch circuits.
Figure 5:
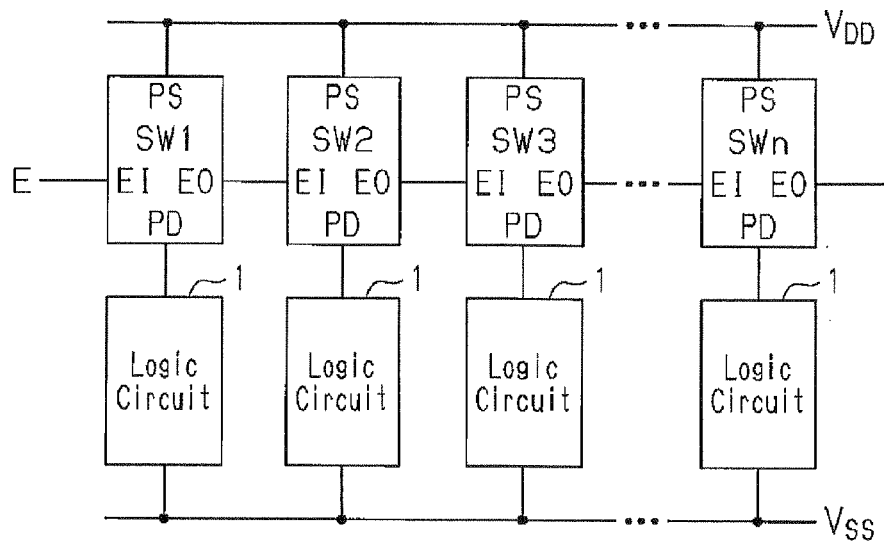
FIG. 5 is a block diagram showing a prior art semiconductor integrated circuit including a plurality of power switch circuits.
Figure 6:
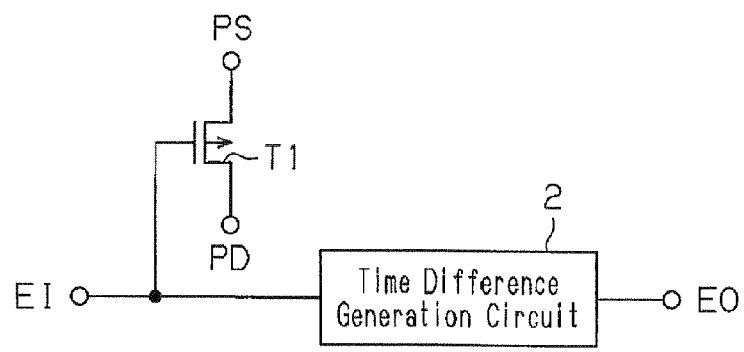
FIG. 6 is a circuit diagram of the power switch circuit of FIG. 5.
Figure 7:
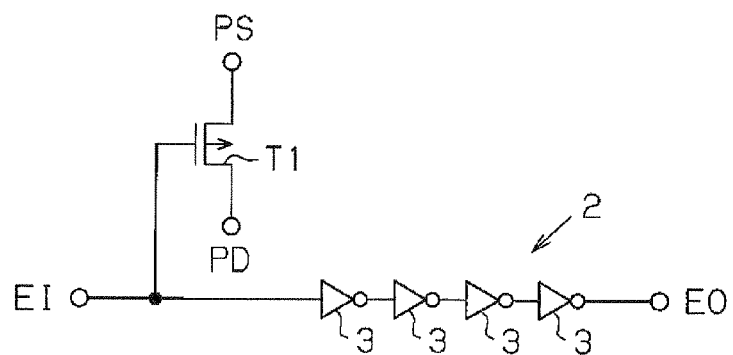
FIG. 7 is a circuit diagram of the power switch circuit of FIG. 5.

FIG. 4 shows a third embodiment. In the third embodiment, switch transistors Ts (T5, T6, T7, and T8 in FIG. 4) are arranged between the logic circuits 1 and the power switch circuits SWX1 to SWXn of the first embodiment. Further, control signals E1 to En are provided from a power control circuit 13 to the gate of each transistor Ts.

The transistors Ts are configured by P-channel MOS transistors and connect the logic circuits 1 and the power switch circuits SWX1 to SWXn when the control signal E1 through En falls to an L level. Further, the transistors Ts uncouple the logic circuits 1 and the power switch circuits SWX1 to SWXn when the control signal E1 through En rises to an H level. The other parts are the same as the first embodiment.

In such a configuration, when the L level control signal E is provided from the power control circuit 13 to the power switch circuit SWX1, the control signal E is sequentially transferred to the power switch circuits in the subsequent stages in the same manner as the first embodiment.

Then, when power $V_{DD}$ is supplied from the terminal PD of each of the power switch circuits SWX1 to SWXn, the power $V_{DD}$ is supplied to the logic circuit 1 through the transistor Ts that has been activated by the control signals E1 to En.

Therefore, the logic circuits 1 supplied with the power $V_{DD}$ from the power switch circuits SWX1 to SWXn are selective with the control signals E1 through En.

When the L level control signal E provided from the power control circuit 13 rises to an H level, the switch transistor is inactivated in each of the power switch circuits SWX1 to SWXn, the supply of power $V_{DD}$ to the terminal PD is stopped, and the flow of leakage current to the logic circuit 1 is stopped.

In addition to the advantages of the first embodiment, the third embodiment has the advantage described below.

(5) The logic circuits 1 that are supplied with the power $V_{DD}$ from the power switch circuits SWX1 to SWXn may be selected with the control signal E1 to En.

What is claimed is:

1. A power switch circuit comprising:
a first transistor which is coupled between a power supply line and a power supply terminal of a logic circuit and outputs, to the power supply terminal of the logic circuit, an output power supply voltage based on a voltage of the power supply line in response to a control signal transferred through a signal path that is independent from the power supply terminal; and
a time difference generation circuit which delays the control signal in accordance with the output power supply voltage of the first transistor, the output power supply voltage being output to the power supply terminal of the logic circuit, by performing a logical process with the control signal and the output power supply voltage of the first transistor.

2. The power switch circuit according to claim 1, wherein the time difference generation circuit includes:
a transfer unit which transfers the control signal; and
a second transistor coupled to the transfer unit which activates the transfer unit in accordance with the output power supply voltage of the first transistor.

3. The power switch circuit according to claim 2, wherein the transfer unit is activated by the second transistor in accordance with the output power supply voltage of the first transistor when the control signal has a first level, and the control signal is transferred independently from the second transistor when the control signal has a second level.

4. The power switch circuit according to claim 1, wherein:
the first transistor has a first control terminal which inputs the control signal, a first terminal coupled to a high potential power supply, and a second terminal which outputs the output power supply voltage; and
the time difference generation circuit includes:
a second transistor having a second control terminal coupled to the second terminal of the first transistor, a third terminal coupled to a low potential power supply, and a fourth terminal;
a first inverter circuit coupled between the high potential power supply and the low potential power supply and having a first input terminal, which is coupled to the first control terminal of the first transistor, and a first output terminal; and
a second inverter circuit coupled between the high potential power supply and the fourth terminal of the second transistor and having a second input terminal, which is coupled to the first output terminal of the first inverter circuit, and a second output terminal.

5. The power switch circuit according to claim 1, wherein:
the first transistor has a first control terminal which inputs the control signal, a first terminal coupled to a high potential power supply, and a second terminal which outputs the output power supply voltage; and the time difference generation circuit includes:
a second transistor having a second control terminal coupled to the second terminal of the first transistor, a third terminal coupled to a low potential power supply, and a fourth terminal;
a first inverter circuit coupled between the high potential power supply and the fourth terminal of the second transistor and having a first input terminal, which is coupled to the first control terminal of the first transistor, and a first output terminal; and
a second inverter circuit coupled between the high potential power supply and the low potential power supply and having a second input terminal, which is coupled to the first output terminal of the first inverter circuit, and a second output terminal.

6. The power switch circuit according to claim 1, wherein:
the first transistor increases the output power supply voltage in accordance with a voltage of the high potential power supply; and
the time difference generation circuit includes a second transistor activated when the output power supply voltage of the first transistor becomes close to the voltage of the high potential power supply.

7. The power switch circuit according to claim 1, wherein:
the first transistor generates the output power supply voltage with a high potential power supply; and
the time difference generation circuit includes:
an even number of inverter circuits; and
a second transistor responsive to the output power supply voltage of the first transistor and coupled between the low potential power supply and one of the even number of inverter circuits.

8. A semiconductor integrated circuit device comprising:
a plurality of logic circuits;
a plurality of power switch circuits which sequentially become conductive in response to a control signal and which are respectively coupled to the plurality of logic circuits;
wherein each of the plurality of power switch circuits includes:
a first transistor which generates an output voltage in accordance with a voltage of a high potential power supply in response to the control signal and supplies the output voltage to the corresponding logic circuit; and
a time difference generation circuit which delays the control signal by performing a logical process with the control signal and the output voltage of the first transistor.

9. The semiconductor integrated circuit device according to claim 8, wherein the time difference generation circuit includes:
a transfer unit which transfers the control signal;
a second transistor coupled to the transfer unit which activates the transfer unit in accordance with the output voltage of the first transistor.

10. The semiconductor integrated circuit device according to claim 9, wherein the transfer unit is activated by the second transistor in accordance with the output voltage of the first transistor when the control signal has a first level, and the control signal is transferred independently from the second transistor when the control signal has a second level.

11. The semiconductor integrated circuit device according to claim 8, wherein:
the first transistor has a first control terminal which inputs the control signal, a first terminal coupled to a high potential power supply, and a second terminal which outputs the output voltage; and
the time difference generation circuit includes:
a second transistor having a second control terminal coupled to the second terminal of the first transistor, a third terminal coupled to a low potential power supply, and a fourth terminal;
a first inverter circuit coupled between the high potential power supply and the low potential power supply and having a first input terminal, which is coupled to the first control terminal of the first transistor, and a first output terminal; and
a second inverter circuit coupled between the high potential power supply and the fourth terminal of the second transistor and having a second input terminal, which is coupled to the first output terminal of the first inverter circuit, and a second output terminal.

12. The semiconductor integrated circuit device according to claim 8, wherein:
the first transistor has a first control terminal which inputs the control signal, a first terminal coupled to a high potential power supply, and a second terminal which outputs the output voltage; and
the time difference generation circuit includes:
a second transistor having a second control terminal coupled to the second terminal of the first transistor, a third terminal coupled to a low potential power supply, and a fourth terminal;
a first inverter circuit coupled between the high potential power supply and the fourth terminal of the second transistor and having a first input terminal, which is coupled to the first control terminal of the first transistor, and a first output terminal; and
a second inverter circuit coupled between the high potential power supply and the low potential power supply and having a second input terminal, which is coupled to the first output terminal of the first inverter circuit, and a second output terminal.

13. The semiconductor integrated circuit device according to claim 8, wherein:
the first transistor increases the output voltage in accordance with a voltage of the high potential power supply; and
the time difference generation circuit includes a second transistor activated when the output voltage of the first transistor becomes close to the voltage of the high potential power supply.

14. The semiconductor integrated circuit device according to claim 8, wherein the time difference generation circuit includes:
an even number of inverter circuits; and
a second transistor responsive to the output voltage of the first transistor and coupled between the low potential power supply and one of the even number of inverter circuits.

15. The semiconductor integrated circuit device according to claim 14, wherein:
the first transistor is configured by a P-channel MOS transistor coupled between the high potential power supply and the logic circuit; and
the second transistor is configured by an N-channel MOS transistor coupled between the low potential power supply and the one that is in the final stage of the even number of inverter circuits in the time difference generation circuit.

16. The semiconductor integrated circuit device according to claim 14, wherein:

the first transistor is configured by an N-channel MOS transistor coupled between the high potential power supply and the logic circuit;

the even number of inverter circuits in the time difference generation circuit include one or more odd number of inverter circuits; and the second transistor is configured by an N-channel MOS transistor coupled between the low potential power supply and one of the one or more odd number of inverter circuits.

17. The semiconductor integrated circuit device according to claim 8, further comprising:

a logical operation circuit which performs an exclusive OR operation with the control signal that is input to the one of the plurality of power switch circuits in the initial stage and the control signal that is output from the one of the plurality of power switch circuits in the final stage.

18. The semiconductor integrated circuit device according to claim 8, further comprising:

a plurality of switch elements respectively arranged between the plurality of power switch circuits and the plurality of logic circuits.

19. The semiconductor integrated circuit device according to claim 9, further comprising:

a logical operation circuit which performs an exclusive OR operation with the control signal that is input to the one of the plurality of power switch circuits in the initial stage and the control signal that is output from the one of the plurality of power switch circuits in the final stage.

20. The semiconductor integrated circuit device according to claim 9, further comprising:

a plurality of switch elements respectively arranged between the plurality of power switch circuits and the plurality of logic circuits.

* * * * *